United States Patent
Okumura

[11] Patent Number: 5,926,019
[45] Date of Patent: Jul. 20, 1999

[54] SYSTEM FOR EVALUATING THE PLAY BACK OF MAGNETORESISTIVE HEADS

[75] Inventor: Toshiyuki Okumura, Tokyo, Japan

[73] Assignee: NEC Corporation, Tokyo, Japan

[21] Appl. No.: 08/823,241

[22] Filed: Mar. 24, 1997

[30] Foreign Application Priority Data

Mar. 28, 1996 [JP] Japan ................................. 8-073435

[51] Int. Cl.⁶ .............................. G11B 5/455; G11B 5/39; G01R 31/00
[52] U.S. Cl. ......................................... 324/210; 324/537
[58] Field of Search ................................. 324/210, 211, 324/212, 235, 537

[56] References Cited

U.S. PATENT DOCUMENTS 3,706,926  12/1972  Barrager et al. ..................... 324/210
5,517,111   5/1996  Shelor ................................. 324/235

FOREIGN PATENT DOCUMENTS 6-187620  12/1992  Japan.

*Primary Examiner*—Walter E. Snow
*Attorney, Agent, or Firm*—Laff, Whitesel & Saret, Ltd.

[57] ABSTRACT

For evaluating Barkhausen noise of a magnetoresistive head in a frequency range where it is used for read/write of recording media, in an inspection device of a magnetoresistive head (10) of the invention having an external magnetic field generator (1) for applying an external magnetic field to a magnetoresistive element (11) of the magnetoresistive head, and a noise measurement section (2) for evaluating noise of a signal output of the magnetoresistive element according to the external magnetic field, an inductive head (20) is applied in the external magnetic field generator for generating the external magnetic field.

4 Claims, 6 Drawing Sheets

SYSTEM FOR EVALUATING THE PLAY BACK OF MAGNETORESISTIVE HEADS

BACKGROUND OF THE INVENTION

The present invention relates to an inspection device of magnetore-sistive head for checking output characteristics of the magnetoresistive head having a magnetoresistive element.

The magnetoresistive head, commonly used as a playback transducer for reading out information recorded on a magnetic medium, detects signals by way of magnetoresistive effect, that is, change in electric resistance of a ferromagnetic film, such as permalloy, caused by change in intensity of the external magnetic field.

The magnetoresistive head is advantageous compared to inductive magnetic heads, since, its resistance changing proportional to the magnetic field intensity independent of its relative velocity to the magnetic medium, a high output can be expected therewith. It also can be suitably applied for reproducing heads of hard disk drives where compactness and high recording density are required, as the magnetoresistive head can be highly integrated and easily prepared into multiple-elements by applying fine processing technology of the semiconductor manufacturing.

There is developed also a merged type head, wherein a magnetoresistive head and an inductive thin film head are combined for providing compactness and accurate mutual alignment of read/write heads towards recording tracks. The inductive thin film head means here a recording head element with its magnetic core and coil windings formed in thin film by way of the fine processing technology of the semiconductor manufacturing. In such a merged type head, a high reproducing voltage is ensured by applying magnetoresistive film of single magnetic domain to the magnetoresistive element for sensing magnetic field from the recording media.

However, the single domain of magnetoresistive film is sometimes broken due to stresses or distortions accompanying finishing processes of the magnetoresistive head, which causes a fluctuation in reproducing signals of the magnetoresistive head called the Barkhausen noise, degrading playback reliability of the magnetoresistive head.

Particularly, the magnetoresistive film is easy to receive partial stresses from slider finishing works performed in the Head-Gimbal-Assembly (hereafter abbreviated as the HGA) process of the magnetoresistive head, wherein slider surface facing to recording media is lapped. As a result, even with the magnetoresistive film confirmed before the HGA process to be a wafer of single domain generating no Barkhausen noise, there may be found the Barkhausen noise after the HGA process, because of the break of the single domain with the partial stresses of the magnetoresistive film.

Therefore, the Barkhausen noise of magnetoresistive heads should be evaluated after the HGA process.

FIG. 6 is a block diagram illustrating a conventional method for detecting the Barkhausen noise described in a Japanese patent application laid open as a Provisional Publication No. 187620/'94, wherein response characteristics of a magnetoresistive head is measured by applying thereon an external uniform magnetic field generated by an air-core coil, Helmholtz coil, for instance.

In FIG. 6, an external uniform magnetic field 62 is generated by an alternating current Ic flowing in an air-core coil 61 supplied through a constant-current amplifier 41 generated by an oscillator 42. A magnetoresistive head 10 responds to the external uniform magnetic field 62 applied thereon vertically to its surface facing to recording media.

Intensity of the alternating current Ic is converted into voltage value by a resistor 64 to be supplied to an oscilloscope 31 as an X-axis-input. Relation of the alternating current Ic to the external uniform magnetic field 62 is beforehand obtained by measuring the external uniform magnetic field 62 by a gaussmeter, for example. A sense current Is is supplied from a constant-current source 53 into a magnetoresistive element 11 of the magnetoresistive head 10. Output of the magnetoresistive head 10 is amplified by an output amplifier 51 and supplied to a first Y-axis-input terminal of the oscilloscope 31 for displaying characteristic curve thereof in X-Y display mode.

The output level of the magnetoresistive head 10 is optimized at the best operational point on its characteristic curve by controlling a bias current Ib flowing through a bias conductor 13 provided in the magnetoresistive head 10 supplied by a controllable constant current source 59. The output of the magnetoresistive head 10 is also supplied into a second Y-axis-inpiit terminal of the oscilloscope 31 after its fundamental frequency component is eliminated through a differential and filtering circuit 52.

When there is no Barkhausen noise produced in the magnetoresistive element 11 of the magnetoresistive head 10 responding to the external uniform magnetic field 62, no fluctuation is observed in the wave form of the second Y-axis-input of the oscilloscope 31 corresponding to the output through the differential and filtering circuit 52 without fundamental frequency component, as it is varying according to alternating current Ic generating the external uniform magnetic field 62.

When there is some Barkhausen noise because of the magnetoresistive element 11 having not single domain, they make fluctuations corresponding thereto independent of the X-axis-input, in the wave form of the second Y-axis-input.

Thus, the Barkhausen noise is checked in the conventional method.

However, there are following problems in the conventional method.

First, the Barkhausen noise in a frequency range where the magnetoresistive head 10 is actually used for read/write of recording media can not be checked, because the air-core coil 61 can not generate sufficient strong external uniform magnetic field 62 in such a high frequency range. Therefore, another Barkhausen noise measurement must be performed after the magnetoresistive head 10 is put together into a hard disk drive. This is a demerit for the mass-productivity.

Second, the Barkhausen noise caused by a magnetic field not uniform such as that originated from a micro portion of recording media can not be checked, because the air-core coil 61 can not apply diagonal magnetic field components to the magnetoresistive element 11 but a normal uniform magnetic field 62. Therefore, magnetoresistive heads 10 to be used for high recording density hard disk drives can not be checked with sufficient reliability.

Third, Barkhausen noise measurement considering spacing between the magnetoresistive head 10 and the recording media can not be performed, because it is performed in a uniform magnetic field 62 generated by the air-core coil 61.

SUMMARY OF THE INVENTION

Therefore, a primary object of the present invention is to provide an inspection device for evaluating the Barkhausen noise of magnetoresistive heads after the HGA process. A second object is to provide an inspection device for evaluating the Barkhausen noise of the magnetoresistive head after the HGA process also in a frequency range where the magnetoresistive heads are actually used for read/write of recording media. A third object is to provide an inspection device for evaluating the Barkhausen noise of magnetoresistive heads also in a magnetic field not uniform such as that originated from a micro portion of recording media. And a fourth object of the present invention is to provide an inspection device for evaluating the Barkhausen noise of magnetoresistive heads also considering spacing between the magnetoresistive heads and the recording media.

In order to achieve the objects, in an inspection device of a magnetoresistive head of the invention having an external magnetic field generator for applying an external magnetic field to a magnetoresistive element of the magnetoresistive head, and a noise measurement section for evaluating noise of a signal output of the magnetoresistive element according to the external magnetic field, an inductive head is applied in the external magnetic field generator for generating the external magnetic field.

Therefore the Barkhausen noise of magnetoresistive heads can be evaluated, in the present invention, in a frequency range where the magnetoresistive heads are actually used for read/write of recording media, since the magnetoresistive heads respond to alternating exciting magnetic field generated by an inductive head, and they can be evaluated also in a magnetic field not uniform such as that originated from a micro portion of recording media or that when the magnetoresistive heads are offset from recording tracks, since relative layout of the inductive head to the magnetoresistive heads is controllable and inductive heads having various track widths are applicable therein.

The inspection device may comprise means for adjusting location of the inductive head relative to the magnetoresistive element.

Therefore, the Barkhausen noise of magnetoresistive heads can be evaluated also considering spacing of the magnetoresistive heads and recording media in actual hard disk drives, in the invention.

BRIEF DESCRIPTION OF THE DRAWINGS

The foregoing, further objects, features, and advantages of this invention will become apparent from a consideration of the following description, the appended claims, and the accompanying drawings in which the same numerals indicate the same or the corresponding parts.

DETAILED DESCRIPTION OF THE PREFERRED EMBODIMENTS

Now, embodiments of the present invention will be described in connection with the drawings.

Figure 1:
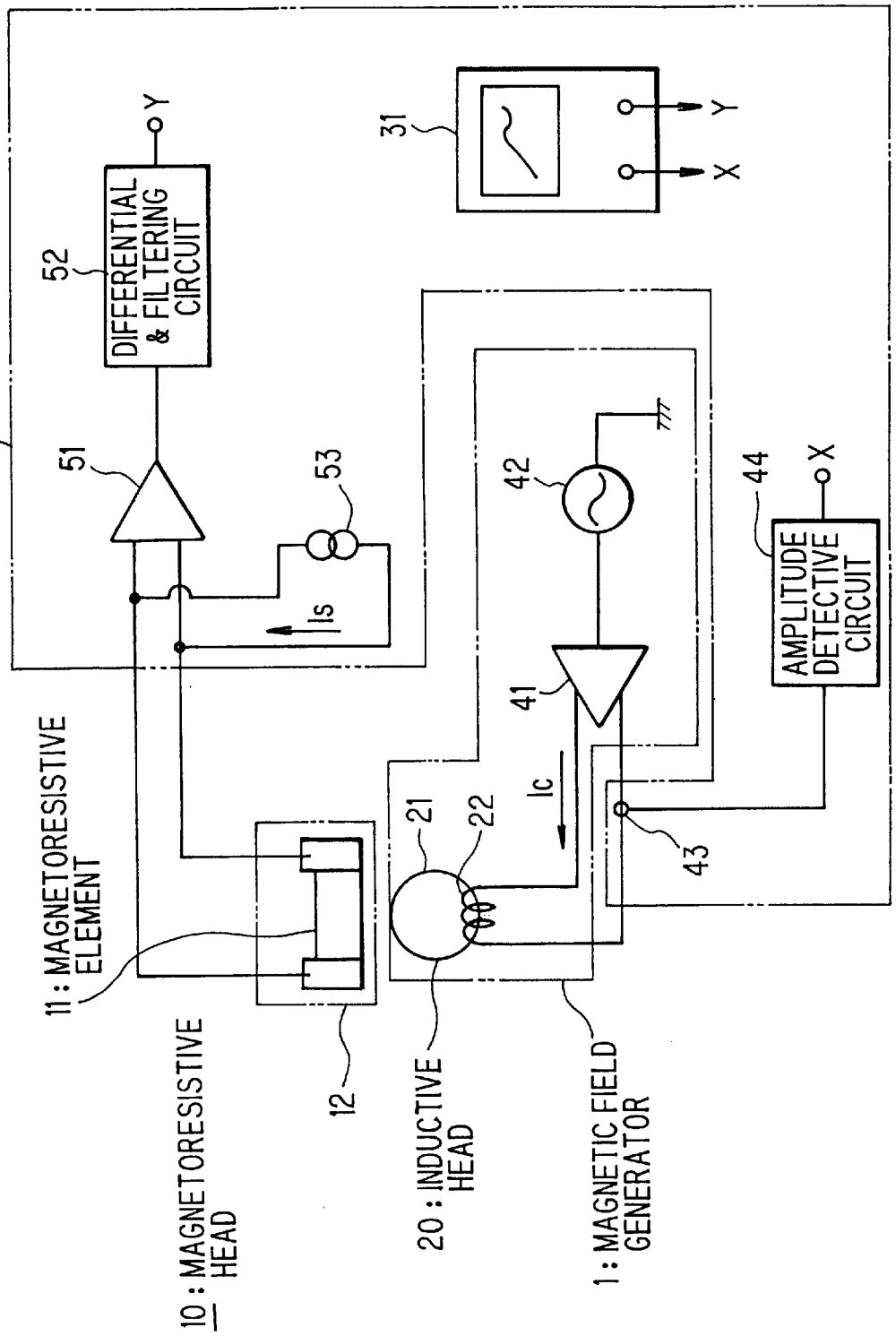
FIG. 1 is a block diagram illustrating a first embodiment of the invention.

FIG. 1 is a block diagram illustrating a first embodiment of the invention.

An inspection device according to the first embodiment comprises an external magnetic field generator 1 including an inductive head 20 for applying an external magnetic field to a magnetoresistive element 11 of a magnetoresistive head 10, and a noise measurement section 2 for measuring noise components detected in output characteristic of the magnetoresistive element 11 to the external magnetic field applied thereon.

The inductive head 20 has a magnetic core 21 prepared with soft magnetic material and wound by an exciting coil 22, which is connected to a constant-current amplifier 41 to be supplied with an alternating current Ic generated by an oscillator 42. Intensity of the alternating current Ic is detected by a current probe 43 and supplied into an X-axis-input terminal of an oscilloscope 31 in an X-Y display mode through an amplitude detective circuit 44.

The magnetoresistive element 11 of the magnetoresistive head 10, assembled in the HGA process with a slider 12 supported by a suspension, is connected to a constant-current source 53 to be supplied with a sense current Is. Output of the magnetoresistive head 10 is amplified by an output amplifier 51, of which noise component is supplied to a Y-axis-input terminal of the oscilloscope 31, fundamental frequency component thereof eliminated through a differential and filtering circuit 52.

Figure 2:
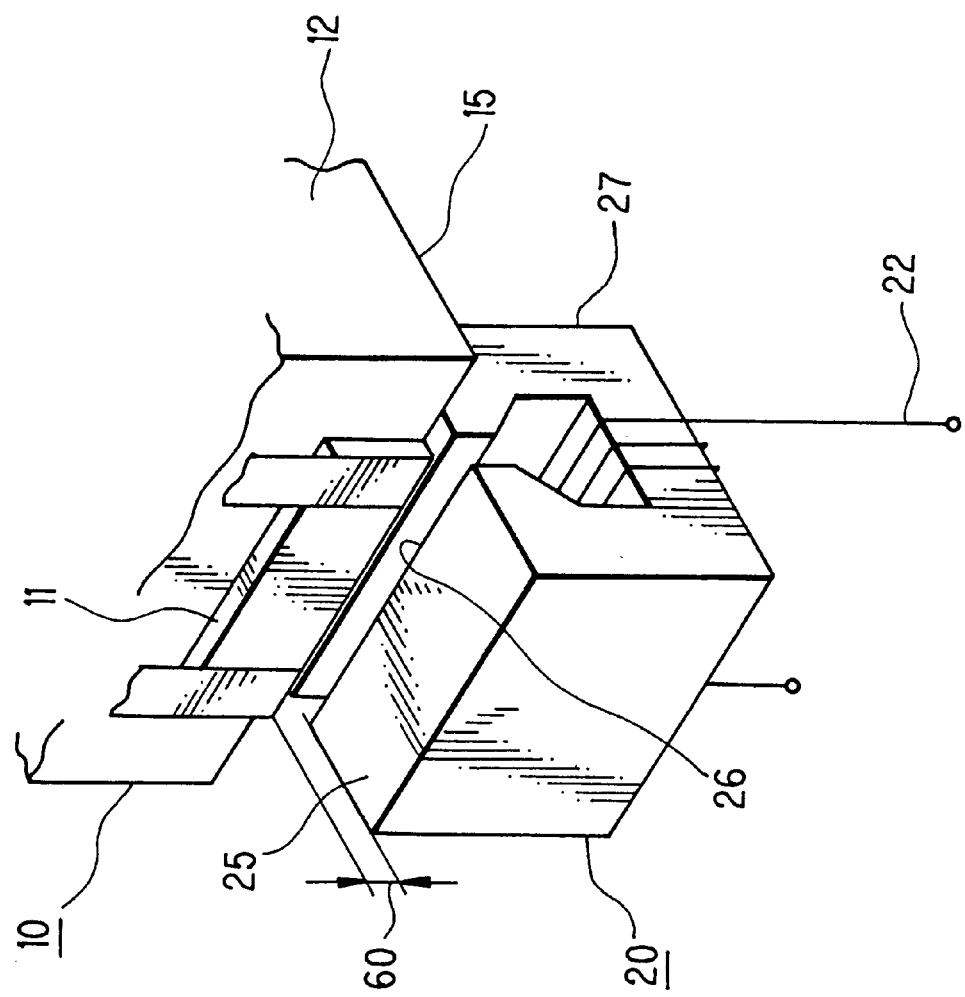
FIG. 2 is a perspective view illustrating a layout structure of a magnetoresistive head 10 and an inductive magnetic head 20 according to the embodiment of FIG. 1.
Figure 2:
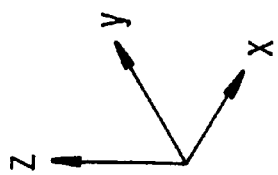

Now, details of the inductive head 20 and its layout relative to the magnetoresistive head 10 is described referring to a perspective view of FIG. 2 illustrating a layout structure of the magnetoresistive head 10 and the inductive head 20 according to the embodiment of FIG. 1.

The magnetoresistive head 10 and the inductive head 20 are placed in such a manner that their recording media facing surfaces 15 and 25 face to each other with a separation 60 corresponding to spacing between a magnetic head and recording media in a hard disk drive, that at least one of the two heads 10 and 20 can change its position to the other parallel with the recording media facing surfaces 15 and 25, that is, in a direction parallel to x-y plane indicated in FIG. 2, and that the longitudinal direction of gap of the inductive head 20 looks in the same direction with that perpendicular to film surface of the magnetoresistive element 11 of the magnetoresistive head 10, namely in the y direction in FIG. 2.

The separation 60 between the recording media facing surface 25 of the inductive head 20 and the recording media facing surface 15 of the magnetic head 10 may be maintained by coating each of these surfaces 15 and 25 with a spacer made of non-conductive and non-magnetic material. And, as for the inductive head 20, there may be also applied an MIG (Metal In Gap) type head provided in its gap with high saturation-magnetic-flux-density material, or a thin film inductive head having a magnetic core and coil windings prepared making use of the fine processing technology of the semiconductor manufacturing.

Referring now to FIGS. 1 and 2, operation of the embodiment is described.

The frequency of the alternating current Ic, which is supplied to the exciting coil 22 of the inductive head 20 from the oscillator 42 through the constant-current amplifier 41, is set in the same frequency range as that normally used in read/write operation of hard disk drives. The alternating current Ic generates an alternating magnetic field in the gap of the inductive head 20, of which field direction at a gap edge 26 is normal to the recording media facing surface 25 of the inductive head 20, that is, in the z direction in FIG. 2.

The sense current Is being supplied to the magnetoresistive head 10 and output characteristic of the magnetoresistive element 11 optimized, the gap edge 26 of the inductive head is placed just facing to the magnetoresistive element 11 of the magnetoresistive head 10.

Thus, an alternating magnetic field generated in the z direction from the gap edge 26 is applied to the magnetoresistive element 11 and magnetoresistance of the magnetoresistive element 11 varies according to the alternating magnetic field, which is detected and amplified by the output amplifier 51.

Output of the amplitude detective circuit 44 corresponding to the alternating current Ic is supplied to the X-axis-input terminal of the oscilloscope 31, and output of the output amplifier 52 corresponding to variation of the magnetoresistance is supplied to the Y-axis-input terminal after differentiated and its fundamental frequency component suppressed by the differential and filtering circuit 52.

Thus, the Barkhausen noise, that is, nonlinear alteration of the magnetoresistance to the external magnetic field is displayed on the oscilloscope 31 as a pulse like wave form.

As heretofore described, with the inspection device according to the embodiment;

the Barkhausen noise of magnetoresistive heads in a frequency range where the magnetoresistive heads are actually used for read/write of recording media can be evaluated, since the magnetoresistive heads respond to alternating exciting magnetic field generated by an inductive head, the Barkhausen noise of magnetoresistive heads also in a magnetic field not uniform such as that originated from a micro portion of recording media or that when the magnetoresistive heads are offset from recording tracks can be evaluated, since relative layout of the inductive head to the magnetoresistive heads is controllable and inductive heads having various track widths are applicable therein, and the Barkhausen noise of magnetoresistive heads can be evaluated considering spacing of the magnetoresistive heads and recording media in actual hard disk drives, since the separation of the inductive head to the magnetoresistive heads is controllable.

Figure 3:
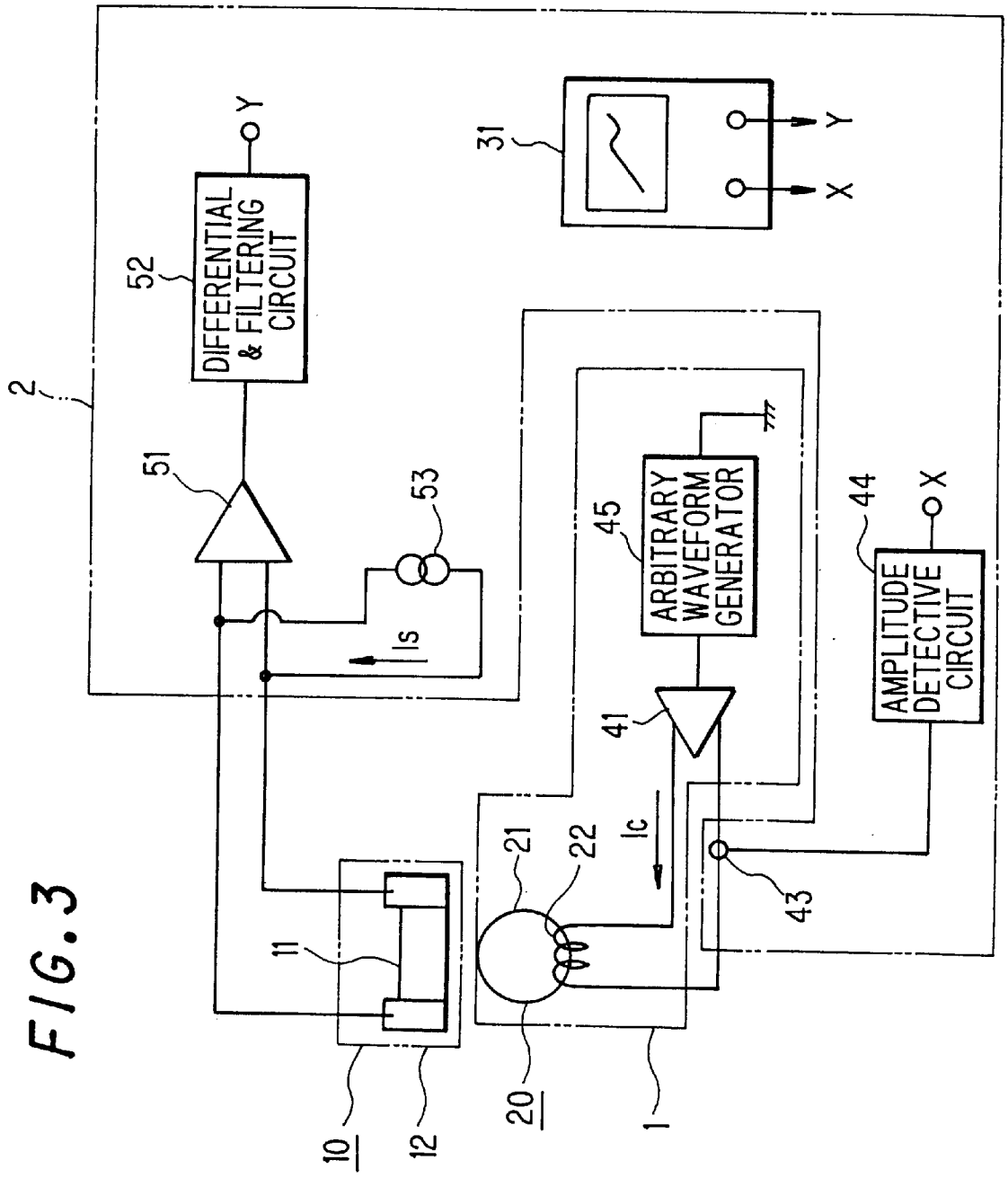
FIG. 3 is a block diagram illustrating a second embodiment of the invention.

FIG. 3 is a block diagram illustrating a second embodiment of the present invention, wherein an arbitrary waveform generator 45 is provided as a signal source for a constant-current amplifier 41 that supplies the alternating current Ic to the exciting coil 22 of the inductive head 20, replacing the oscillator 42 of FIG. 1.

In an actual hard disk drive, various frequencies are mixed in the magnetic field applied to the magnetoresistive head 10, so there may be Barkhausen noise which cannot be detected with measurement in one single frequency. To deal with the problem, the arbitrary waveform generator 45 which can generate various waveforms including constant current is provided in the second embodiment for supplying to the exciting coil 22. Therefore, the Barkhausen noise in external magnetic field having various waveforms such as pulse like magnetic field can be evaluated in the embodiment.

Figure 4:
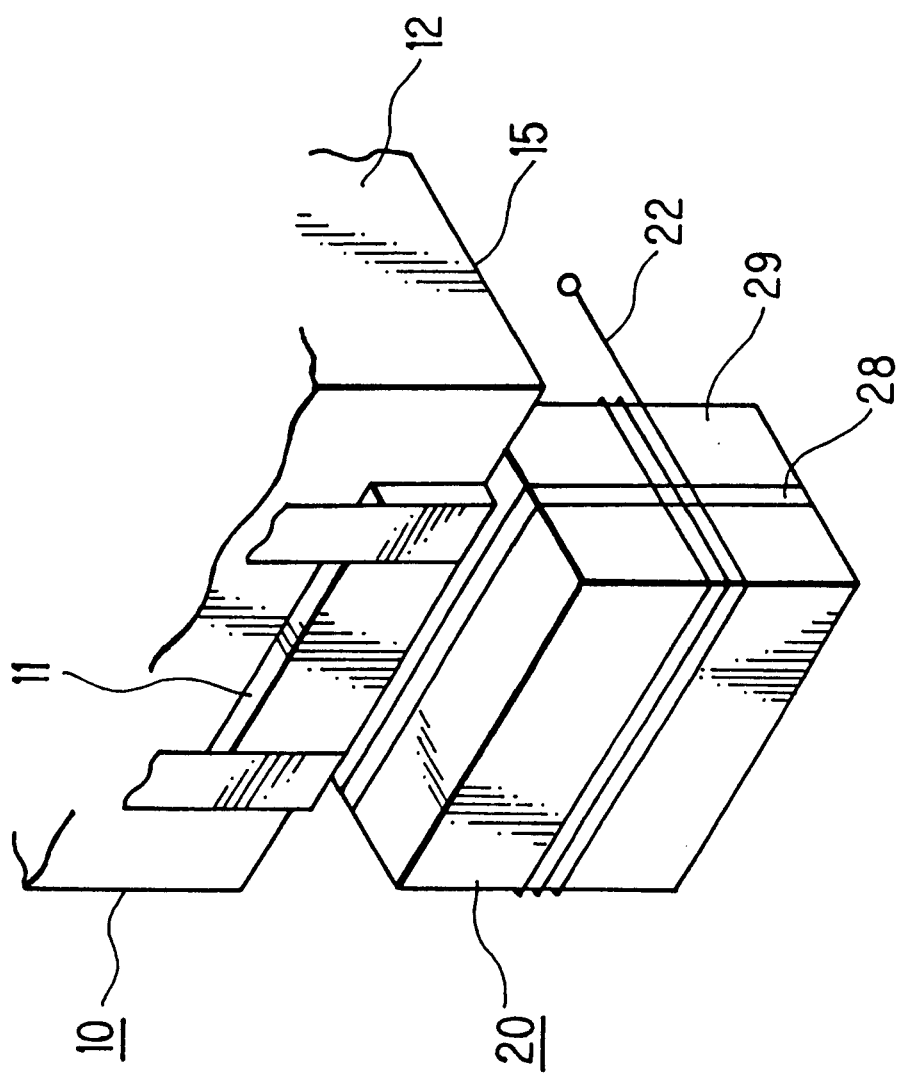
FIG. 4 is a perspective view illustrating a single pole head according to a third embodiment of the invention.

FIG. 4 is a perspective view illustrating a single pole head according to a third embodiment of the invention, which is applied as the inductive head 20 of FIG. 1 or FIG. 3 in place of the ring type inductive head of FIG. 2. The single pole head of FIG. 4, having a thin film core 28 of soft magnetic material sandwiched between non-magnetic substrates 29 and wound by an exciting coil 22, is such located as surface of the thin film core becomes parallel to that of the magnetoresistive element 11.

When a ring type inductive head such as that of FIG. 2 is used as the inductive head 20, there is a problem that its magnetic field could not penetrate efficiently into the magnetoresistive element 11 due to normal component relatively weak to parallel component of the magnetic field with recording media facing surface thereof.

With the single pole head of the third embodiment, magnetic field having dominant component normal to its recording media facing surface is obtained and magnetic field from residual magnetization of recording media can be well simulated. So, the Barkhausen noise can be evaluated in an environment similar to an actual head/media system.

As for the single pole head, a field modulation head used for a magneto-optical disk drive may be applied.

Figure 5:
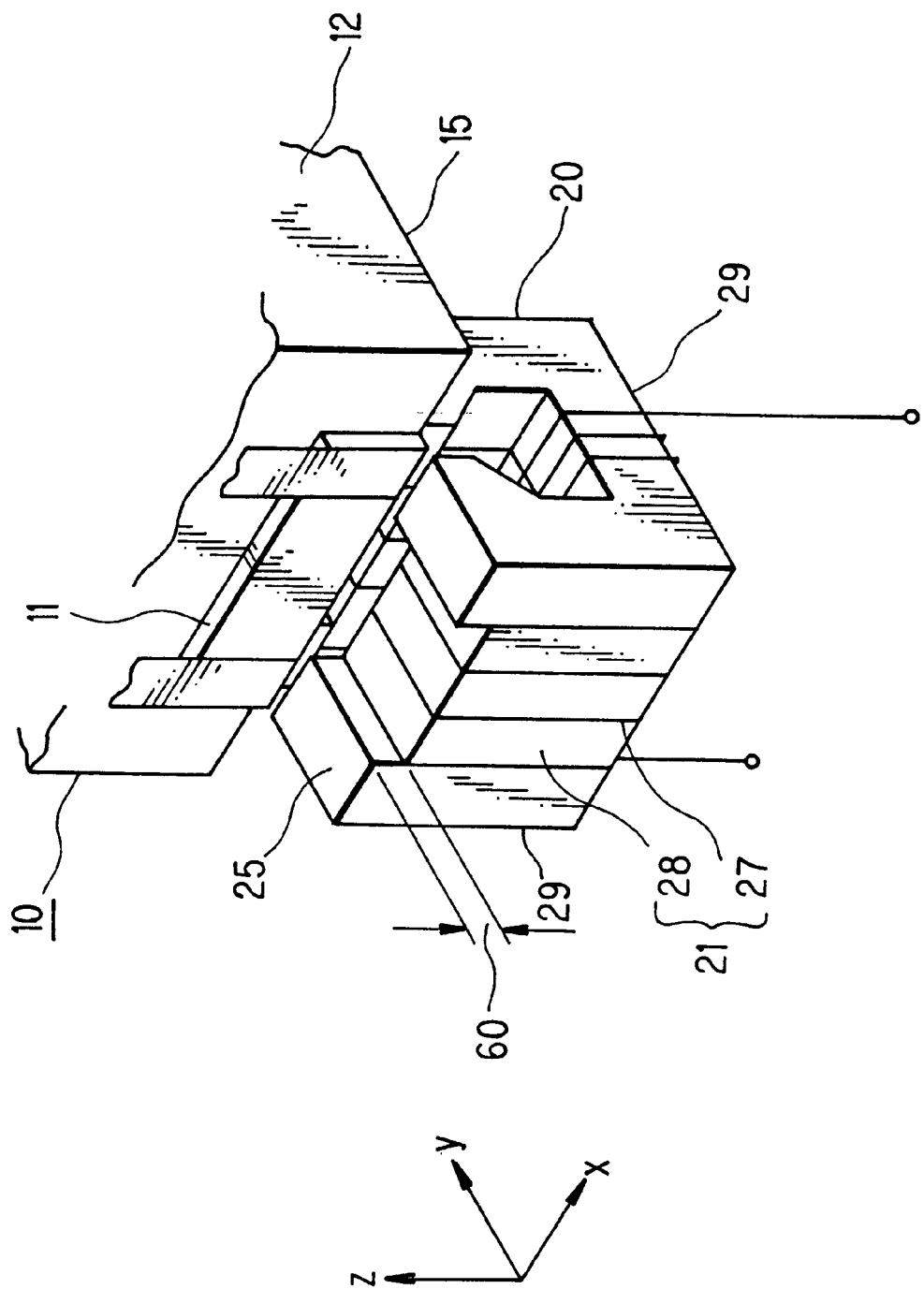
FIG. 5 is a perspective view illustrating a lamination head according to a fourth embodiment of the invention.
Figure 6:
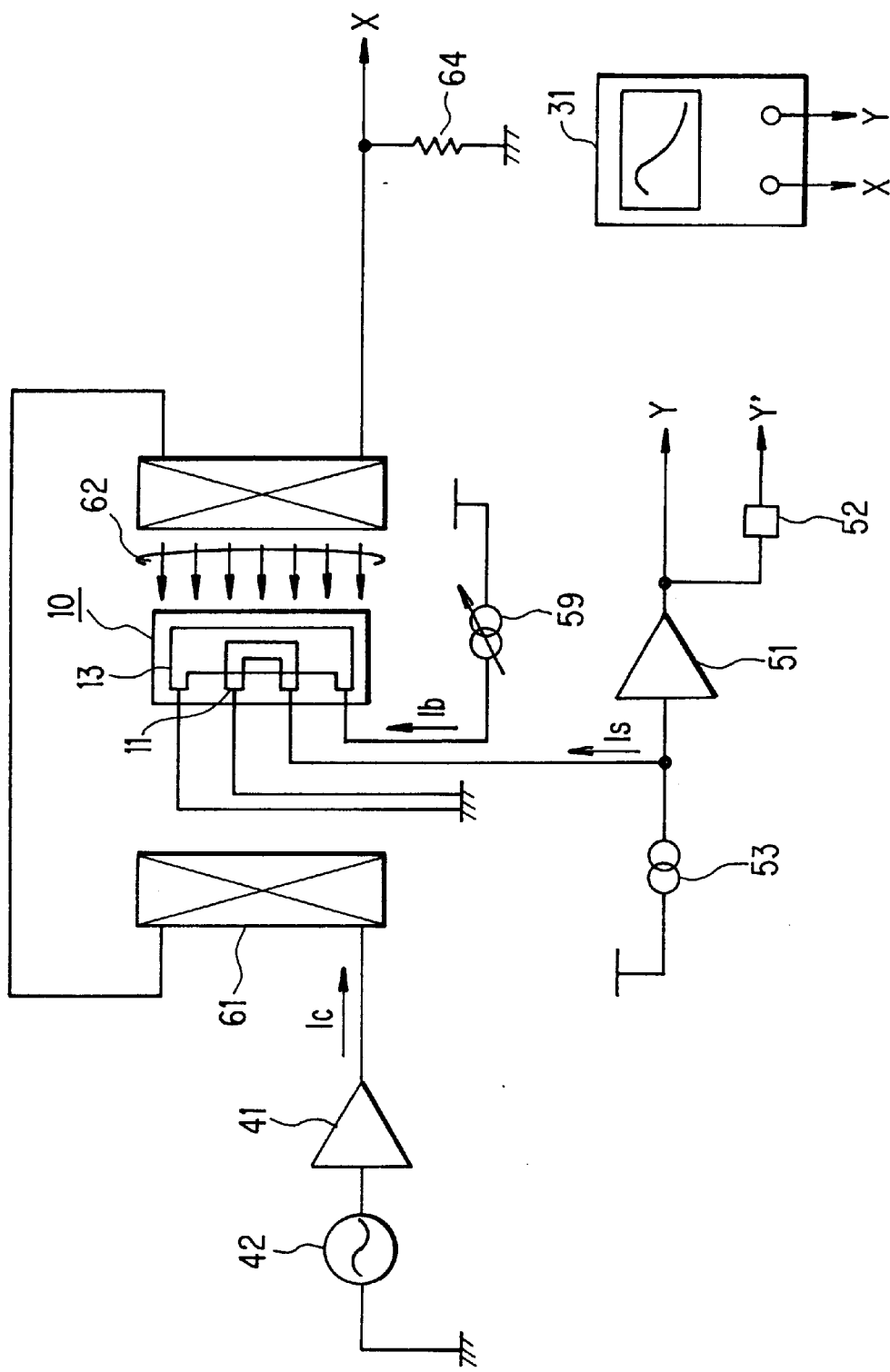
FIG. 6 is a block diagram illustrating a conventional method for checking the Barkhausen noise.

FIG. 5 is a perspective view illustrating a lamination head according to a fourth embodiment of the invention to be applied for the inductive head 20 of FIG. 1 or FIG. 3. The lamination head has a lamination core 21 comprising a lamination of soft magnetic film layers 28 and non-magnetic thin films 27 sandwiched between non-magnetic subtrates 29, and is located in such a way that longitudinal direction of gap thereof becomes perpendicular to film surface of the magnetoresistive element 11, that is in y direction in FIG. 5.

With the inductive head of FIG. 2, there is a difficulty of locating the inductive head just facing to the magnetoresistive head 10, or of preparing spacers for coating the recording media facing surfaces 15 and 25 to maintain the separation 60 between them correctly, making the Barkhausen noise evaluation a little troublesome.

With the lamination head of FIG. 5, its lamination core 21 can be easily set behind the recording media facing surface 25 with a dent having desired depth by controlling lapping amount of the recording media facing surface 25.

So, according to the fifth embodiment, the Barkhausen noise of magnetoresistive heads 10 can be evaluated easily by putting the recording media facing surface 25 of the inductive head 20 in contact to the recording media facing surfaces 15 of the magnetoresistive heads 10, by preparing the depth of the dent of the lamination core 21 as the same with head/media spacing of disk drives where the magnetoresistive heads 10 are to be applied.

What is claimed is:

1. An inspection device of a magnetoresistive head having an external magnetic field generator for applying an external magnetic field to a magnetoresistive element of the magnetoresistive head, and a noise measurement section for evaluating noise of a signal output of the magnetoresistive element according to the external magnetic field, wherein:

an inductive head is applied to the external magnetic field generator for generating the external magnetic field, said inductive head having substantially the same size and performance characteristics as an inductive head for writing information on to a recording medium which the magnetoresistive head reads, the external magnetic field generator comprisng an arbitrary waveform generator for generating a signal having a desired waveform to be supplied for exciting said inductive head said signal having a frequency range corresponding to a frequency which is reproduced by the magnetoresistive head when reading the recording medium.

2. An inspection device recited in claim 1, comprising means for adjusting location of said inductive head relative to the magnetoresistive element.

3. An inspection device recited in claim 1, wherein a single pole head is applied for said inductive head.

4. An inspection device recited in claim 1, comprising means for defining a separation between said inductive head and the magnetoresistive element.

* * * * *